(12) United States Patent  (10) Patent No.: US 7,917,241 B2
Hofmeester et al.  (45) Date of Patent: Mar. 29, 2011

(54) METHOD AND SYSTEM FOR INCREASING THROUGHPUT DURING LOCATION SPECIFIC PROCESSING OF A PLURALITY OF SUBSTRATES

(75) Inventors: Nicolaus J. Hofmeester, Danvers, MA (US); Steven P. Caliendo, Ashby, MA (US)

(73) Assignee: TEL Epion Inc., Billerica, MA (US)

( * ) Notice: Subject to any disclaimer, the term of this patent is extended or adjusted under 35 U.S.C. 154(b) by 430 days.

(21) Appl. No.: 11/832,198

(22) Filed: Aug. 1, 2007

(65) Prior Publication Data
US 2009/0037015 A1 Feb. 5, 2009

(51) Int. Cl.
*G06F 19/00* (2006.01)
*C23F 1/00* (2006.01)

(52) U.S. Cl. ........... 700/110; 702/84; 438/5; 156/345.4; 216/66

(58) Field of Classification Search .......... 700/108–110, 700/121, 160, 166, 173–175; 702/84; 438/5–14, 438/712; 156/345.4; 118/723 CB, 723 FI; 216/66; 250/492.2, 492.21, 492.3
See application file for complete search history.

(56) References Cited

U.S. PATENT DOCUMENTS

| | | | |
|---|---|---|---|
| 4,361,762 A | 11/1982 | Douglas | |
| 4,886,971 A | 12/1989 | Matsumura et al. | |
| 4,916,311 A | 4/1990 | Fuzishita et al. | |
| 5,863,682 A | 1/1999 | Abe et al. | |
| 5,871,805 A * | 2/1999 | Lemelson | 427/8 |
| 6,416,820 B1 * | 7/2002 | Yamada et al. | 427/530 |
| 6,537,606 B2 | 3/2003 | Allen et al. | |
| 6,560,504 B1 * | 5/2003 | Goodwin et al. | 700/121 |
| 6,750,460 B2 | 6/2004 | Greer | |
| 2002/0130275 A1 | 9/2002 | Mack et al. | |
| 2003/0049376 A1 * | 3/2003 | Schwarm et al. | 427/255.28 |

FOREIGN PATENT DOCUMENTS

JP  62296357 A  12/1987

OTHER PUBLICATIONS

Wikipedia (free on-line encyclopedia). Nov. 5, 2008. Retrieved from the Internet: URL:http://en.wikipedia.org/wiki/Assembly_line. 6 pages.
European Patent Office, International Search Report issued in corresponding PCT Application serial No. PCT/US2008/071412 dated Nov. 27, 2008.
European Patent Office, Office Action issued in related European Application No. 03 749 734.4 dated Oct. 5, 2009.
European Patent Office, Office Action issued in related European Application No. 05 729 563.6 dated Sep. 24, 2009.
Yamada, et al., "Surface modification with gas cluster ion beams", Nuclear Instruments and Methods in Physics Research B79 (1993) 223-226 North-Holland.
Saitoh, et al., "Acceleration of cluster and molecular ions by TIARA 3 MV tandem accelerator", Nuclear Instruments and Methods in Physics Research A 452 (2000) 61-66).

* cited by examiner

*Primary Examiner* — Sean P Shechtman
(74) *Attorney, Agent, or Firm* — Wood, Herron & Evans LLP

(57) ABSTRACT

A method and system of location specific processing on a plurality of substrates is described. The method comprises measuring metrology data for the plurality of substrates. Thereafter, the method comprises computing correction data for a first substrate using the metrology data, followed by computing correction data for a second substrate using the metrology data. While computing the correction data for a second substrate, the method comprises applying the correction data for a first substrate to the first substrate using a gas cluster ion beam (GCIB).

20 Claims, 4 Drawing Sheets

METHOD AND SYSTEM FOR INCREASING THROUGHPUT DURING LOCATION SPECIFIC PROCESSING OF A PLURALITY OF SUBSTRATES

CROSS-REFERENCE TO RELATED APPLICATIONS

This application is related to U.S. Pat. No. 6,537,606, entitled "SYSTEM AND METHOD FOR IMPROVING THIN FILMS BY GAS CLUSTER ION BEAM PROCESSING", and U.S. Pat. No. 6,750,460, entitled "SYSTEM AND METHOD FOR ADJUSTING THE PROPERTIES OF A DEVICE BY GCIB PROCESSING". The entire contents of each publication are herein incorporated by reference in their entirety.

BACKGROUND OF THE INVENTION

1. Field of Invention

The present invention relates to a method and system for treating a substrate using a gas cluster ion beam (GCIB), and more particularly to a method and system of using a GCIB for location specific processing on a plurality of substrates.

2. Description of Related Art

Gas-cluster ion beams (GCIB's) are used for etching, cleaning, smoothing, and forming thin films. For purposes of this discussion, gas clusters are nano-sized aggregates of materials that are gaseous under conditions of standard temperature and pressure. Such gas clusters may consist of aggregates including a few to several thousand molecules, or more, that are loosely bound together. The gas clusters can be ionized by electron bombardment, which permits the gas clusters to be formed into directed beams of controllable energy. Such cluster ions each typically carry positive charges given by the product of the magnitude of the electronic charge and an integer greater than or equal to one that represents the charge state of the cluster ion. The larger sized cluster ions are often the most useful because of their ability to carry substantial energy per cluster ion, while yet having only modest energy per individual molecule. The ion clusters disintegrate on impact with the workpiece. Each individual molecule in a particular disintegrated ion cluster carries only a small fraction of the total cluster energy. Consequently, the impact effects of large ion clusters are substantial, but are limited to a very shallow surface region. This makes gas cluster ions effective for a variety of surface modification processes, but without the tendency to produce deeper sub-surface damage that is characteristic of conventional ion beam processing.

Conventional cluster ion sources produce cluster ions having a wide size distribution (scaling with the number of molecules in each cluster that may reach several thousand molecules). Clusters of atoms can be formed by the condensation of individual gas atoms (or molecules) during the adiabatic expansion of high pressure gas from a nozzle into a vacuum. A skimmer with a small aperture strips divergent streams from the core of this expanding gas flow to produce a collimated beam of clusters. Neutral clusters of various sizes are produced and held together by weak inter-atomic forces known as Van der Waals forces. This method has been used to produce beams of clusters from a variety of gases, such as helium, neon, argon, krypton, xenon, nitrogen, oxygen, carbon dioxide, sulfur hexafluoride, nitric oxide, nitrous oxide, and mixtures of these gases. Several emerging applications for GCIB processing of workpieces on an industrial scale are in the semiconductor field. Although GCIB processing of a workpiece is performed using a wide variety of gas-cluster source gases, many of which are inert gases, many semiconductor processing applications use reactive source gases, sometimes in combination or mixture with inert or noble gases, to form the GCIB.

SUMMARY OF THE INVENTION

The present invention relates to a method and system for location specific processing of a substrate using a gas cluster ion beam (GCIB). Furthermore, a method and system for location specific processing of a plurality of substrates is provided.

According to one embodiment, a method of location specific processing on a plurality of substrates is described. The method comprises measuring metrology data for the plurality of substrates. Thereafter, the method comprises computing correction data for a first substrate using the metrology data, followed by computing correction data for a second substrate using the metrology data. While computing the correction data for the second substrate, the method comprises applying the correction data for the first substrate to the first substrate using a gas cluster ion beam (GCIB).

According to another embodiment, a method of, and computer readable medium for, location specific processing on a plurality of substrates is described. The method comprises acquiring metrology data for the plurality of substrates; computing correction data for each of the plurality of substrates using the metrology data; and while computing the correction data for each of the plurality of substrates, applying completed correction data for a given substrate of the plurality of substrates using a gas cluster ion beam (GCIB).

According to yet another embodiment, a processing system configured to perform location specific processing on a plurality of substrates is described. The processing system comprises: a metrology system configured to acquire metrology data for a plurality of substrates, and a GCIB processing system configured to treat one or more of the plurality of substrates with a GCIB. Furthermore, the processing system comprises a multi-process controller configured to: receive the metrology data from the metrology system, compute correction data for each of the plurality of substrates using the metrology data, and while computing the correction data for each of the plurality of substrates, instruct the GCIB processing system to apply completed correction data to a given substrate of the plurality of substrates using a gas cluster ion beam (GCIB).

DETAILED DESCRIPTION

Figure 1:
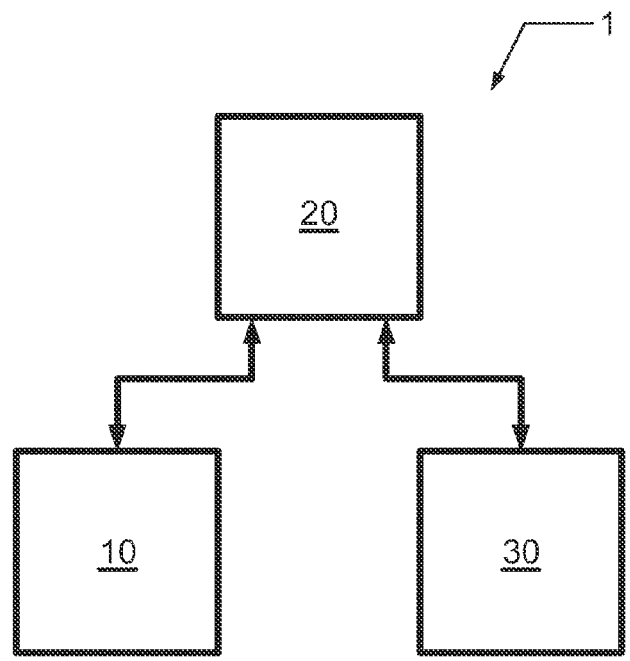
FIG. 1 is a block diagram of a processing system according to an embodiment.

A method and system for performing location specific processing on a plurality of substrates using a gas cluster ion beam (GCIB) is disclosed in various embodiments. However, one skilled in the relevant art will recognize that the various embodiments may be practiced without one or more of the specific details, or with other replacement and/or additional methods, materials, or components. In other instances, well-known structures, materials, or operations are not shown or described in detail to avoid obscuring aspects of various embodiments of the invention. Similarly, for purposes of explanation, specific numbers, materials, and configurations are set forth in order to provide a thorough understanding of the invention. Nevertheless, the invention may be practiced without specific details. Furthermore, it is understood that the various embodiments shown in the figures are illustrative representations and are not necessarily drawn to scale.

In the description and claims, the terms "coupled" and "connected," along with their derivatives, are used. It should be understood that these terms are not intended as synonyms for each other. Rather, in particular embodiments, "connected" may be used to indicate that two or more elements are in direct physical or electrical contact with each other while "coupled" may further mean that two or more elements are not in direct contact with each other, but yet still co-operate or interact with each other.

Reference throughout this specification to "one embodiment" or "an embodiment" means that a particular feature, structure, material, or characteristic described in connection with the embodiment is included in at least one embodiment of the invention, but do not denote that they are present in every embodiment. Thus, the appearances of the phrases "in one embodiment" or "in an embodiment" in various places throughout this specification are not necessarily referring to the same embodiment of the invention. Furthermore, the particular features, structures, materials, or characteristics may be combined in any suitable manner in one or more embodiments. Various additional layers and/or structures may be included and/or described features may be omitted in other embodiments.

There is a general need for adjusting the properties of a substrate, including a plurality of substrates, using a gas cluster ion beam (GCIB). For example, the adjustment of properties on a substrate may comprise correcting non-uniformities on the substrate using a GCIB. These non-uniformities can include variations in parametric data for an upper layer of the substrate, such as variations in geometrical, mechanical, electrical and/or optical parameters associated with the upper layer or one or more devices formed in or on the upper layer of the substrate. By correcting non-uniformities of an upper layer of an incoming substrate and/or systematic non-uniformities caused by inherent variation in a process tool, enhanced yield of viable devices may be provided, as well as a more repeatable and constant process may be obtained. In addition to correcting non-uniformities, the adjustment of properties on a substrate may comprise creating specifically intended variations in an upper layer of the substrate.

As illustrated in FIG. 1, a processing system 1 configured to perform location specific processing on a plurality of substrates is described according to one embodiment. The processing system 1 comprises a metrology system 10 configured to acquire metrology data for a plurality of substrates, and a GCIB processing system 30 configured to treat one or more of the plurality of substrates with a GCIB. Furthermore, the processing system 1 comprises a multi-process controller 20 configured to: receive the metrology data from the metrology system 10, compute correction data for each of the plurality of substrates using the metrology data, and while computing the correction data for each of the plurality of substrates, instruct the GCIB processing system 30 to apply completed correction data to a given substrate of the plurality of substrates using a gas cluster ion beam (GCIB).

Figure 2:
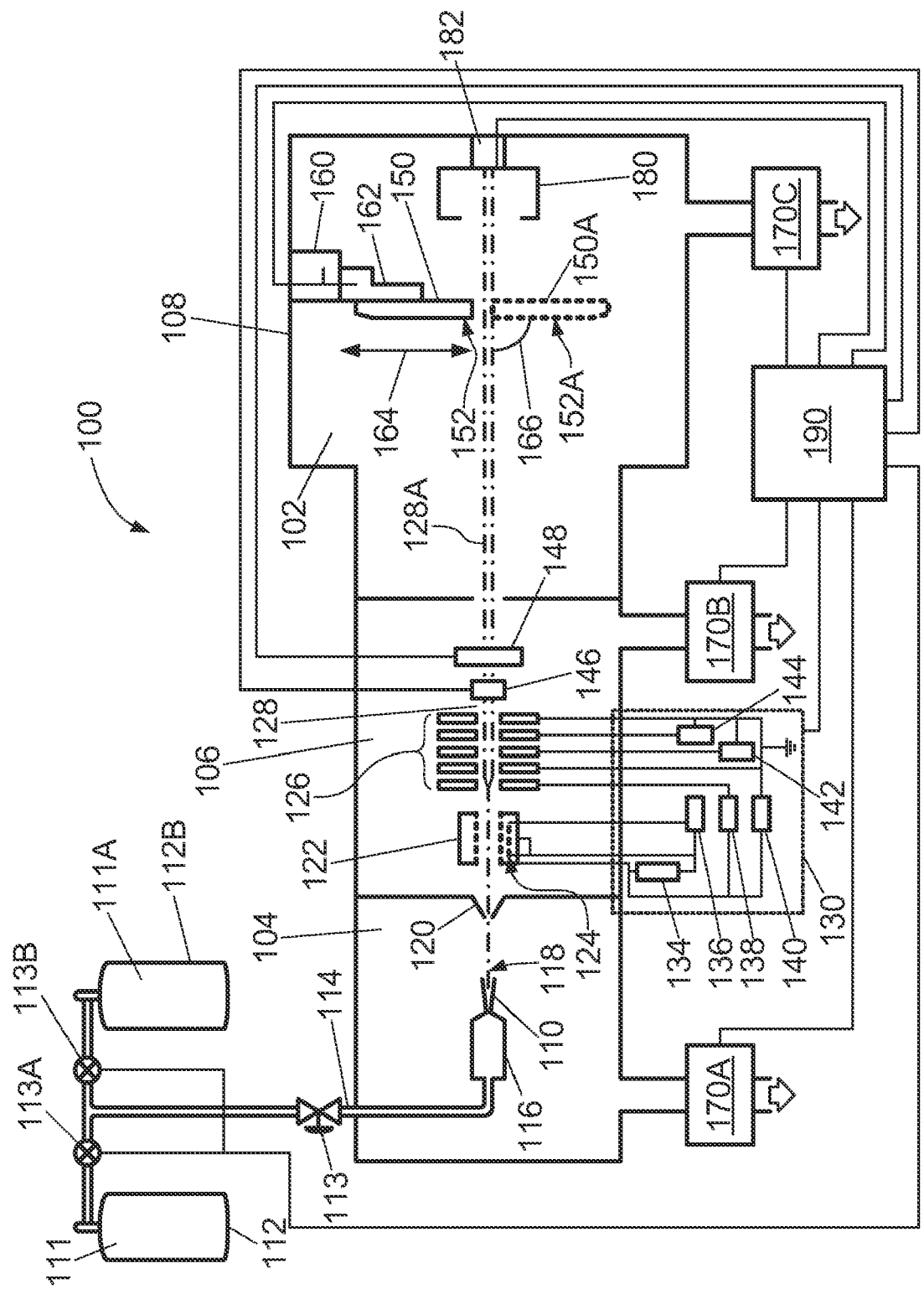
FIG. 2 is a diagrammatic view of a GCIB processing system.

According to another embodiment, a GCIB processing system 100 is depicted in FIG. 2 comprising a vacuum vessel 102, substrate holder 150, upon which a substrate 152 to be processed is affixed, and vacuum pumping systems 170A, 170B, and 170C. Substrate 152 can be a semiconductor substrate, a wafer, a flat panel display (FPD), a liquid crystal display (LCD), or any other workpiece. GCIB processing system 100 is configured to produce a GCIB for treating substrate 152 to treat substrate 152.

Referring still to GCIB processing system 100 in FIG. 2, the vacuum vessel 102 comprises three communicating chambers, namely, a source chamber 104, an ionization/acceleration chamber 106, and a processing chamber 108 to provide a reduced-pressure enclosure. The three chambers are evacuated to suitable operating pressures by vacuum pumping systems 170A, 170B, and 170C, respectively. In the three communicating chambers, a gas cluster beam can be formed in the first chamber, while a gas cluster ion beam can be formed in the second chamber wherein the gas cluster beam is ionized and optionally accelerated, and then in the third chamber the accelerated or non-accelerated gas cluster ion beam may be utilized to treat substrate 152.

A first gas composition 111 stored in a first gas source 112 is admitted under pressure through a first gas control valve 113A to a gas metering valve or valves 113. Additionally, an optional second gas composition 111A stored in a second gas source 112A is admitted under pressure through a second gas control valve 113B to the gas metering valve or valves 113. According to one example, the first gas composition can include a condensable inert gas. For example, the inert gas can include a noble gas, i.e., He, Ne, Ar, Kr, Xe, or Rn. Additionally, according to another example, the second gas composition can comprise a film forming gas composition, an etching gas composition, a cleaning gas composition, a smoothing gas composition, etc. Furthermore, the first gas source 111 and the second gas source 111A may be utilized either alone or in combination with one another to produce ionized clusters comprising helium, neon, argon, krypton, xenon, nitrogen, oxygen, hydrogen, methane, nitrogen trifluoride, carbon dioxide, sulfur hexafluoride, nitric oxide, or nitrous oxide, or any combination of two or more thereof.

The high pressure, condensable gas comprising the first gas composition or the second gas composition or both is introduced through gas feed tube 114 into stagnation chamber 116 and is ejected into the substantially lower pressure vacuum through a properly shaped nozzle 110. As a result of the expansion of the high pressure, condensable gas from the stagnation chamber 116 to the lower pressure region of the source chamber 104, the gas velocity accelerates to supersonic/hypersonic speeds and gas jet 118 emanates from nozzle 110.

The inherent cooling of the jet as static enthalpy is exchanged for kinetic energy, which results from the expansion in the jet, causes a portion of the gas jet 118 to condense and form clusters, each consisting of from several to several thousand weakly bound atoms or molecules. A gas skimmer 120, positioned downstream from the exit of the nozzle 110 between the source chamber 104 and ionization/acceleration chamber 106, partially separates the gas molecules on the peripheral edge of the gas jet 118, that may have not condensed into a cluster, from the gas molecules in the core of the gas jet, that may have formed clusters. Among other reasons, this selection of a portion of gas jet 118 can lead to a reduction in the pressure in the downstream regions where higher pressures may be detrimental (e.g., ionizer 122, and processing chamber 108). Furthermore, gas skimmer 120 defines an initial dimension for the gas cluster beam entering the acceleration/ionization chamber 106.

After the gas jet 118 has been formed in the source chamber 104, the constituent gas clusters in gas jet 118 are ionized by ionizer 122 to form GCIB 128. The ionizer 122 may include an electron impact ionizer that produces electrons from one or more filaments 124, which are accelerated and directed to collide with the gas clusters in the gas jet 118 inside the ionization/acceleration chamber 106. Upon collisional impact with the gas cluster, electrons of sufficient energy eject electrons from molecules in the gas clusters to generate ionized molecules. The ionization of gas clusters can lead to a population of charged gas cluster ions, generally having a net positive charge.

As shown in FIG. 2, beam electronics 130 are utilized to ionize, extract, accelerate, and focus the GCIB 128. The beam electronics 130 include a filament power supply 136 that provides voltage $V_F$ to heat the ionizer filament 124.

Additionally, the beam electronics 130 include a set of suitably biased high voltage electrodes 126 in the ionization/acceleration chamber 106 that extracts the cluster ions from the ionizer 122. The high voltage electrodes 126 then accelerate the extracted cluster ions to a desired energy and focus them to define GCIB 128. The kinetic energy of the cluster ions in GCIB 128 typically ranges from about 1000 electron volts (1 keV) to several tens of keV.

As illustrated in FIG. 2, the beam electronics further include an anode power supply 134 that provides voltage $V_A$ to an anode of ionizer 122 for accelerating electrons emitted from filament 124 and causing the electrons to bombard the gas clusters in gas jet 118, which produces cluster ions.

Additionally, as illustrated in FIG. 2, the beam electronics 130 include an extraction power supply 138 provides voltage $V_E$ to bias at least one of the high voltage electrodes 126 to extract ions from the ionizing region of ionizer 122 and to form the GCIB 128. For example, extraction power supply 136 provides a voltage to a first electrode of the high voltage electrodes 126 that is less than or equal to the anode voltage of ionizer 122.

Furthermore, the beam electronics 130 can include an accelerator power supply 140 that provides voltage $V_{Acc}$ to bias one of the high voltage electrodes 126 with respect to the ionizer 122 so as to result in a total GCIB acceleration energy equal to about $V_{Acc}$ electron volts (eV). For example, accelerator power supply 136 provides a voltage to a second electrode of the high voltage electrodes 126 that is less than or equal to the anode voltage of ionizer 122 and the extraction voltage of the first electrode.

Further yet, the beam electronics 130 can include lens power supplies 142, 144 that may be provided to bias some of the high voltage electrodes 126 with potentials (e.g., $V_{L1}$ and $V_{L2}$) to focus the GCIB 128. For example, lens power supply 142 can provide a voltage to a third electrode of the high voltage electrodes 126 that is less than or equal to the anode voltage of ionizer 122, the extraction voltage of the first electrode, and the accelerator voltage of the second electrode, and lens power supply 144 can provide a voltage to a fourth electrode of the high voltage electrodes 126 that is less than or equal to the anode voltage of ionizer 122, the extraction voltage of the first electrode, the accelerator voltage of the second electrode, and the first lens voltage of the third electrode. A beam filter 146 in the ionization/acceleration chamber 106 can be utilized to eliminate monomers, or monomers and light cluster ions from the GCIB 128 to define a filtered process GCIB 128A that enters the processing chamber 108.

Referring still to FIG. 2, a beam gate 148 is disposed in the path of GCIB 128 in the ionization/acceleration chamber 106. Beam gate 148 has an open state in which the GCIB 128 is permitted to pass from the ionization/acceleration chamber 106 to the processing chamber 108 to define process GCIB 128A, and a closed state in which the GCIB 128 is blocked from entering the processing chamber 108. A control cable conducts control signals from control system 190 to beam gate 148. The control signals controllably switch beam gate 148 between the open or closed states.

A substrate 152, which may be a wafer or semiconductor wafer, a flat panel display (FPD), a liquid crystal display (LCD), or other substrate to be processed by GCIB processing, is disposed in the path of the process GCIB 128A in the processing chamber 108. Because most applications contemplate the processing of large substrates with spatially uniform results, a scanning system may be desirable to uniformly scan the process GCIB 128A across large areas to produce spatially homogeneous results.

An X-scan actuator 160 provides linear motion of the substrate holder 150 in the direction of X-scan motion (into and out of the plane of the paper). A Y-scan actuator 162 provides linear motion of the substrate holder 150 in the direction of Y-scan motion 164, which is typically orthogonal to the X-scan motion. The combination of X-scanning and Y-scanning motions translates the substrate 152, held by the substrate holder 150, in a raster-like scanning motion through process GCIB 128A to cause a uniform (or otherwise programmed) irradiation of a surface of the substrate 152 by the process GCIB 128A for processing of the substrate 152.

The substrate holder 150 disposes the substrate 152 at an angle with respect to the axis of the process GCIB 128A so that the process GCIB 128A has an angle of beam incidence 166 with respect to a substrate 152 surface. The angle of beam incidence 166 may be 90 degrees or some other angle, but is typically 90 degrees or near 90 degrees. During Y-scanning, the substrate 152 and the substrate holder 150 move from the shown position to the alternate position "A" indicated by the designators 152A and 150A, respectively. Notice that in moving between the two positions, the substrate 152 is scanned through the process GCIB 128A, and in both extreme positions, is moved completely out of the path of the process GCIB 128A (over-scanned). Though not shown explicitly in FIG. 1, similar scanning and over-scan is performed in the (typically) orthogonal X-scan motion direction (in and out of the plane of the paper).

A beam current sensor 180 may be disposed beyond the substrate holder 150 in the path of the process GCIB 128A so as to intercept a sample of the process GCIB 128A when the substrate holder 150 is scanned out of the path of the process GCIB 128A. The beam current sensor 180 is typically a faraday cup or the like, closed except for a beam-entry opening, and is typically affixed to the wall of the vacuum vessel 102 with an electrically insulating mount 182.

As shown in FIG. 2, control system 190 connects to the X-scan actuator 160 and the Y-scan actuator 162 through electrical cable and controls the X-scan actuator 160 and the Y-scan actuator 162 in order to place the substrate 152 into or out of the process GCIB 128A and to scan the substrate 152 uniformly relative to the process GCIB 128A to achieve desired processing of the substrate 152 by the process GCIB 128A. Control system 190 receives the sampled beam current collected by the beam current sensor 180 by way of an electrical cable and, thereby, monitors the GCIB and controls the GCIB dose received by the substrate 152 by removing the substrate 152 from the process GCIB 128A when a predetermined dose has been delivered.

Figure 3:
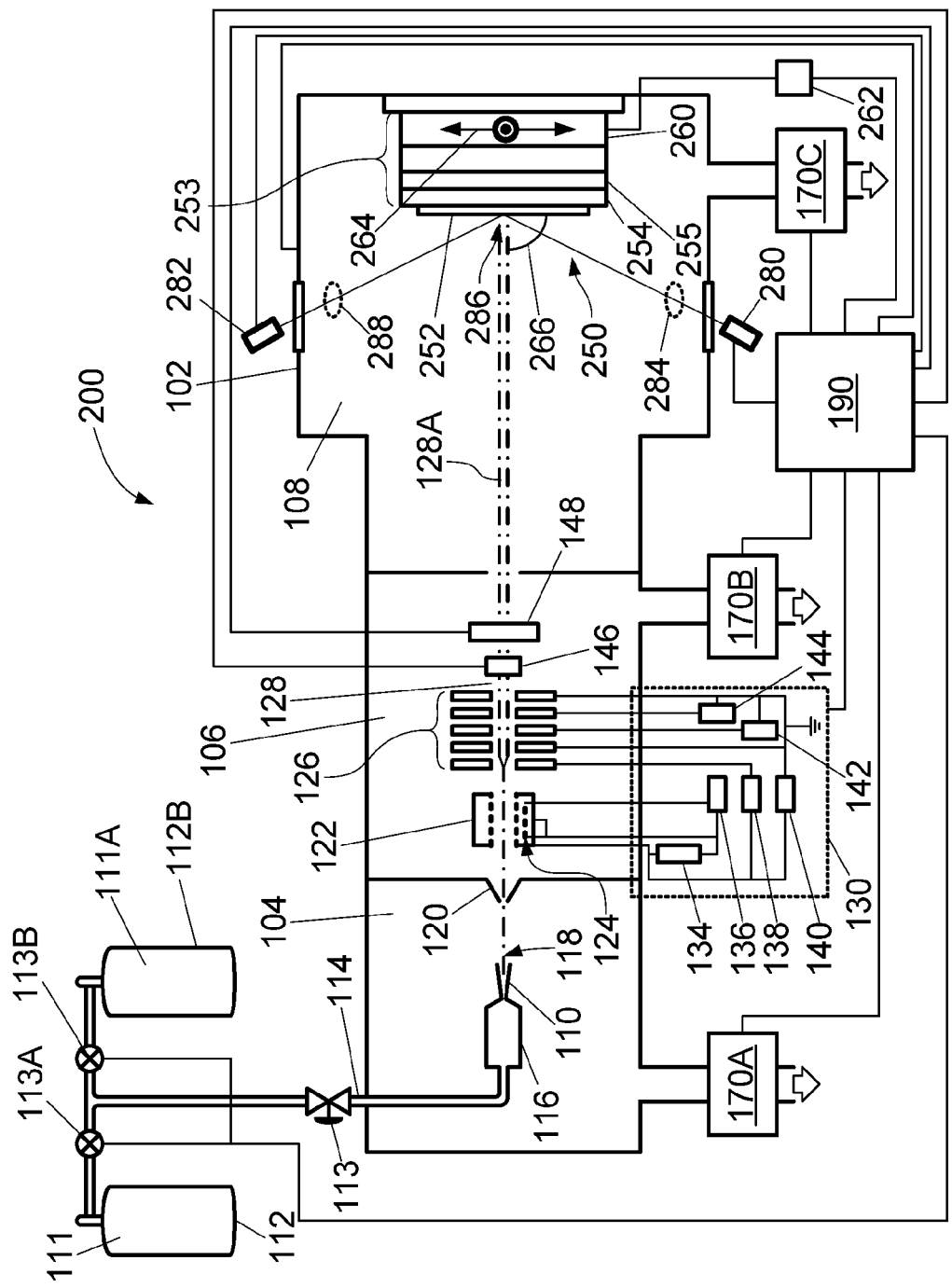
FIG. 3 is a diagrammatic view of another GCIB processing system.

In the embodiment shown in FIG. 3, the GCIB processing system 200 can be similar to the embodiment of FIG. 2 and further comprise a X-Y positioning table 253 operable to hold and move a substrate 252 in two axes, effectively scanning the substrate 252 relative to the process GCIB 128A. For example, the X-motion can include motion into and out of the plane of the paper, and the Y-motion can include motion along direction 264.

The process GCIB 128A impacts the substrate 252 at a projected impact region 286 on a surface of the substrate 252. By X-Y motion, the X-Y positioning table 253 can position each portion of a surface of the substrate 252 in the path of process GCIB 128A so that every region of the surface may be made to coincide with the projected impact region 286 for processing by the process GCIB 128A. An X-Y controller 262 provides electrical signals to the X-Y positioning table 253 through an electrical cable for controlling the position and velocity in each of X-axis and Y-axis directions. The X-Y controller 262 receives control signals from, and is operable by, control system 190 through an electrical cable. X-Y positioning table 253 moves by continuous motion or by stepwise motion according to conventional X-Y table positioning technology to position different regions of the substrate 252 within the projected impact region 286. In one embodiment, X-Y positioning table 253 is programmably operable by the control system 190 to scan, with programmable velocity, any portion of the substrate 252 through the projected impact region 286 for GCIB processing by the process GCIB 128A.

The substrate holding surface 254 of positioning table 253 is electrically conductive and is connected to a dosimetry processor operated by control system 190. An electrically insulating layer 255 of positioning table 253 isolates the substrate 252 and substrate holding surface 254 from the other portions of the positioning table 253. Electrical charge induced in the substrate 252 by the impinging process GCIB 128A is conducted through substrate 252 and substrate holding surface 254, and a signal is coupled through the positioning table 253 to control system 190 for dosimetry measurement. Dosimetry measurement has integrating means for integrating the GCIB current to determine a GCIB processing dose. Under certain circumstances, a target-neutralizing source (not shown) of electrons, sometimes referred to as electron flood, may be used to neutralize the GCIB 128A. In such case, a Faraday cup (not shown) may be used to assure accurate dosimetry despite the added source of electrical charge.

In operation, the control system 190 signals the opening of the beam gate 148 to irradiate the substrate 252 with the process GCIB 128A. The control system 190 monitors measurements of the GCIB current collected by the substrate 252 in order to compute the accumulated dose received by the substrate 252. When the dose received by the substrate 252 reaches a predetermined dose, the control system 190 closes the beam gate 148 and processing of the substrate 252 is complete.

Alternatively, the process GCIB 128A may be scanned at a constant velocity in a fixed pattern across the surface of the substrate 252; however, the GCIB intensity is modulated (may be referred to as Z-axis modulation) to deliver an intentionally non-uniform dose to the sample. The GCIB intensity may be modulated in the GCIB processing apparatus 200 by any of a variety of methods, including varying the gas flow from a GCIB source supply; modulating the ionizer by either varying a filament voltage VF or varying an anode voltage VA; modulating the lens focus by varying lens voltages VL1 and/or VL2; or mechanically blocking a portion of the gas cluster ion beam with a variable beam block, adjustable shutter, or variable aperture. The modulating variations may be continuous analog variations or may be time modulated switching or gating.

The processing chamber 108 may further include an in-situ metrology system. For example, the in-situ metrology system may include an optical diagnostic system having an optical transmitter 280 and optical receiver 282 configured to illuminate substrate 252 with an incident optical signal 284 and to receive a scattered optical signal 288 from substrate 252, respectively. The optical diagnostic system comprises optical windows to permit the passage of the incident optical signal and the scattered optical signal into and out of the processing chamber 108. Furthermore, the optical transmitter 280 and the optical receiver 282 may comprise transmitting and receiving optics, respectively. The optical transmitter 280 receives, and is responsive to, controlling electrical signals from the control system 190. The optical receiver 282 returns measurement signals to the control system 190. The in-situ metrology system may comprise any instrument configured to monitor the progress of the GCIB processing.

Control system 190 comprises a microprocessor, memory, and a digital I/O port capable of generating control voltages sufficient to communicate and activate inputs to GCIB processing system 100 (or 200) a as well as monitor outputs from GCIB processing system 100 (or 200). Moreover, control system 190 can be coupled to and can exchange information with vacuum pumping systems 170A, 170B, and 170C, first gas source 111, second gas source 112, first gas control valve 113A, second gas control valve 113B, beam electronics 130, beam filter 146, beam gate 148, the X-scan actuator 160, the Y-scan actuator, and beam current sensor 180. For example, a program stored in the memory can be utilized to activate the inputs to the aforementioned components of GCIB processing system 100 (or 200) according to a process recipe in order to perform a GCIB process on substrate 152 (or 252). One example of control system 190 is a DELL PRECISION WORKSTATION 610™, available from Dell Corporation, Austin, Tex.

Substrate 152 (or 252) can be affixed to the substrate holder 150 (or substrate holder 250) via a clamping system (not shown), such as a mechanical clamping system or an electrical clamping system (e.g., an electrostatic clamping system). Furthermore, substrate holder 150 (or 250) can include a heating system (not shown) or a cooling system (not shown) that is configured to adjust and/or control the temperature of substrate holder 150 (or 250) and substrate 152 (or 252).

Vacuum pumping systems 170A, 170B, and 170C can include turbo-molecular vacuum pumps (TMP) capable of pumping speeds up to about 5000 liters per second (and greater) and a gate valve for throttling the chamber pressure. In conventional vacuum processing devices, a 1000 to 3000 liter per second TMP can be employed. TMPs are useful for low pressure processing, typically less than about 50 mTorr. Furthermore, a device for monitoring chamber pressure (not shown) can be coupled to the vacuum vessel 102 or any of the three vacuum chambers. The pressure measuring device can be, for example, a capacitance manometer or ionization gauge.

Figure 4:
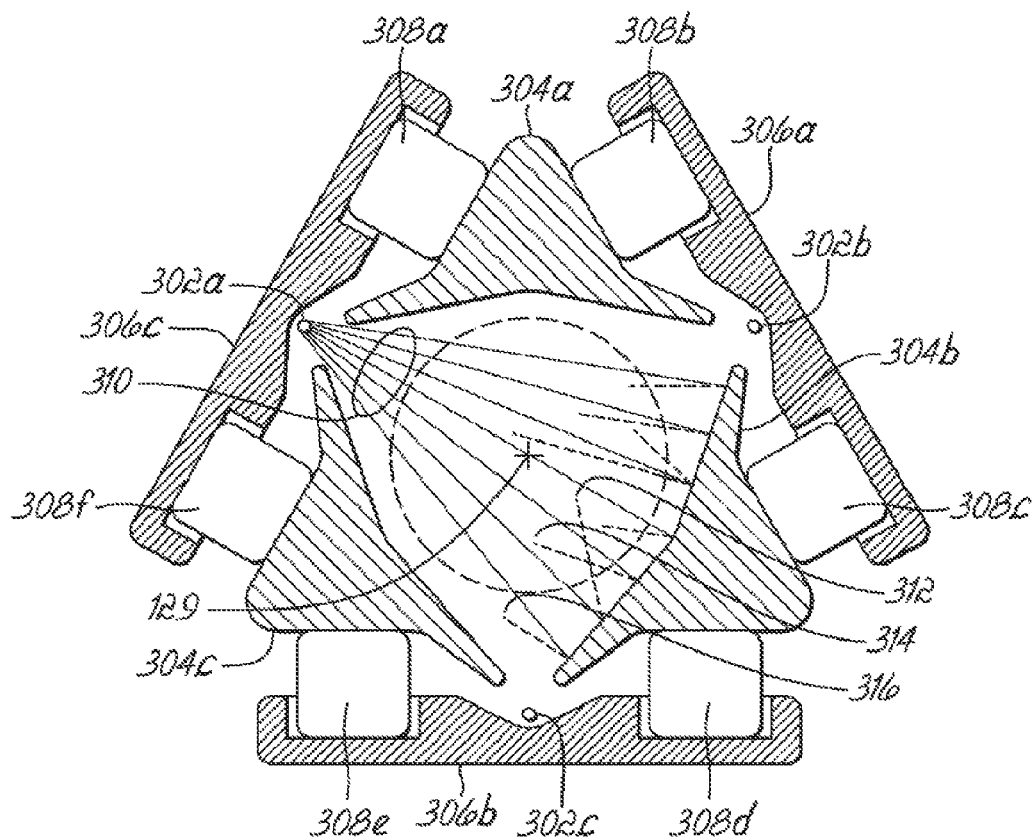
FIG. 4 is a cross-sectional view of an ionization source for a GCIB processing system.

Referring now to FIG. 4, a section of a gas cluster ionizer for ionizing a gas cluster jet is shown. The section is normal to the axis 129 of gas cluster beam 128. For typical gas cluster sizes (2000 to 15000 atoms), clusters leaving the skimmer aperture (120, FIGS. 1 and 2) and entering an ionizer (122, FIGS. 1 and 2) will travel with a kinetic energy of about 130 to 1000 electron volts (eV). At these low energies, any departure from space charge neutrality within the ionizer 122 will result in a rapid dispersion of the jet with a significant loss of beam current. FIG. 3 illustrates a self-neutralizing ionizer. As with other ionizers, gas clusters are ionized by electron impact. In this design, thermo-electrons (seven examples indicated by 310) are emitted from multiple linear thermionic filaments 302a, 302b, and 302c (typically tungsten) and are extracted and focused by the action of suitable electric fields provided by electron-repeller electrodes 306a, 306b, and 306c and beam-forming electrodes 304a, 304b, and 304c. Thermo-electrons 310 pass through the gas cluster jet and the jet axis and then strike the opposite beam-forming electrode 304b to produce low energy secondary electrons (312, 314, and 316 indicated for examples).

Though (for simplicity) not shown, linear thermionic filaments 302b and 302c also produce thermo-electrons that subsequently produce low energy secondary electrons. All the secondary electrons help ensure that the ionized cluster jet remains space charge neutral by providing low energy electrons that can be attracted into the positively ionized gas cluster jet as required to maintain space charge neutrality. Beam-forming electrodes 304a, 304b, and 304c are biased positively with respect to linear thermionic filaments 302a, 302b, and 302c and electron-repeller electrodes 306a, 306b, and 306c are negatively biased with respect to linear thermionic filaments 302a, 302b, and 302c. Insulators 308a, 308b, 308c, 308d, 308e, and 308f electrically insulate and support electrodes 304a, 304b, 304c, 306a, 306b, and 306c. For example, this self-neutralizing ionizer is effective and achieves over 1000 micro Amps argon GCIBs.

Referring again to FIG. 1, metrology system 10 is configured to acquire metrology data for a plurality of substrates. The metrology system 10 may include an ex-situ metrology system or it may include an in-situ metrology system. For example, metrology system 10 may be located ex-situ of the GCIB processing system 30 (100 or 200 in FIG. 2 or 3), which means that the measurement equipment is located outside of the vacuum vessel (label 102 in FIGS. 2 and 3) and separate from the GCIB processing system 30 (100 or 200 in FIG. 2 or 3). Alternatively, for example, metrology system 10 is located in-situ and, to that end, may be contained within the vacuum vessel (label 102 in FIGS. 2 and 3) to allow for in-vacuum measurements on the GCIB processing system 100 (or 200). For instance, metrology system 10 may include the optical diagnostic system depicted in FIG. 3. Alternatively yet, metrology system 10 may be located in-situ outside of the vacuum vessel (label 102 in FIGS. 2 and 3) but may still be considered part of the GCIB processing system 100 (or 200).

Metrology system 10 may comprise any variety of substrate diagnostic systems including, but not limited to, optical diagnostic systems, X-ray fluorescence spectroscopy systems, four-point probing systems, transmission-electron microscope (TEM), atomic force microscope (AFM), scanning-electron microscope (SEM), etc. Additionally, metrology system 10 may comprise an optical digital profilometer (ODP), a scatterometer, an ellipsometer, a reflectometer, an interferometer, or any combination of two or more thereof.

For example, the metrology system 10 may constitute an optical scatterometry system. The scatterometry system may include a scatterometer, incorporating beam profile ellipsometry (ellipsometer) and beam profile reflectometry (reflectometer), commercially available from Therma-Wave, Inc. (1250 Reliance Way, Fremont, Calif. 94539) or Nanometrics, Inc. (1550 Buckeye Drive, Milpitas, Calif. 95035). Additionally, for example, the in-situ metrology system may include an integrated Optical Digital Profilometry (iODP) scatterometry module configured to measure metrology data on a substrate.

Furthermore, referring still to FIG. 1, multi-process controller 20 is configured to: receive the metrology data from the metrology system 10, compute correction data for each of the plurality of substrates using the metrology data, and while computing the correction data for each of the plurality of substrates, instruct the GCIB processing system 30 to apply completed correction data to a given substrate of the plurality of substrates using a gas cluster ion beam (GCIB).

The multi-process controller 20 comprises a microprocessor, memory, and a digital I/O port capable of generating control voltages sufficient to communicate and activate inputs to GCIB processing system 30 (100 or 200 in FIG. 2 or 3) a as well as monitor outputs from GCIB processing system 30 (100 or 200 in FIG. 2 or 3). Moreover, multi-process controller 20 can be coupled to and can exchange information with metrology system 10 and GCIB processing system 30.

The multi-process controller 20 may be implemented as a general purpose computer system that performs a portion or all of the microprocessor based processing steps of the invention in response to a processor executing one or more sequences of one or more instructions contained in a memory. Such instructions may be read into the controller memory from another computer readable medium, such as a hard disk or a removable media drive. One or more processors in a multi-processing arrangement may also be employed as the controller microprocessor to execute the sequences of instructions contained in main memory. In alternative embodiments, hard-wired circuitry may be used in place of or in combination with software instructions. Thus, embodiments are not limited to any specific combination of hardware circuitry and software.

The multi-process controller 20 can be used to configure any number of processing elements, as described above, and the multi-process controller 20 can collect, provide, process, store, and display data from processing elements. The multi-process controller 20 can include a number of applications, as well as a number of controllers, for controlling one or more of the processing elements. For example, multi-process controller 20 can include a graphic user interface (GUI) component (not shown) that can provide interfaces that enable a user to monitor and/or control one or more processing elements.

The multi-process controller 20 can be locally located relative to the GCIB processing system 30 (100 or 200 in FIG. 2 or 3), or it can be remotely located relative to the GCIB processing system 30 (100 or 200 in FIG. 2 or 3). For example, multi-process controller 20 can exchange data with GCIB processing system 30 (100 or 200 in FIG. 2 or 3) using a direct connection, an intranet, and/or the internet. Multi-process controller 20 can be coupled to an intranet at, for example, a customer site (i.e., a device maker, etc.), or it can be coupled to an intranet at, for example, a vendor site (i.e., an equipment manufacturer). Alternatively or additionally, multi-process controller 20 can be coupled to the internet. Furthermore, another computer (i.e., controller, server, etc.) can access multi-process controller 20 to exchange data via a direct connection, an intranet, and/or the internet.

Figure 6:
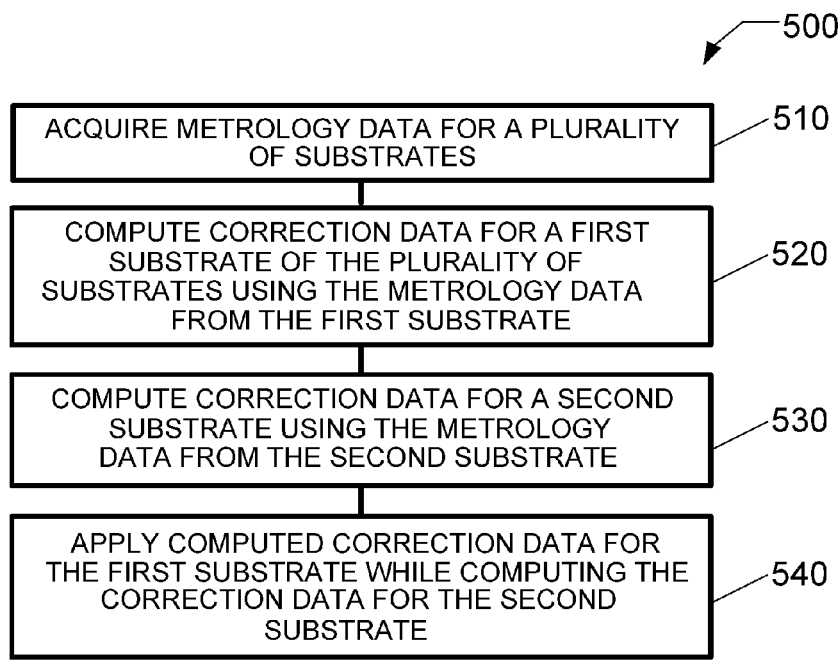
FIG. 6 is a flow chart illustrating a method of treating a substrate according to an embodiment.

Referring now to FIG. 6, a method of location specific processing on a plurality of substrates is described. The method comprises a flow chart 500 beginning in 510 with acquiring metrology data for the plurality of substrates.

The metrology data can include parametric data, such as geometrical, mechanical, electrical and/or optical parameters associated with the upper layer or one or more devices formed in or on the upper layer of the substrate. For example, metrology data can include any parameter measurable by the metrology systems described above. Additionally, for example, metrology data can include a film thickness, a surface roughness, a surface contamination, a feature depth, a trench depth, a via depth, a feature width, a trench width, a via width, a critical dimension (CD), an electrical resistance, or any combination of two or more thereof. Furthermore, for example, metrology data can include one or more measurable parameters for one or more surface acoustic wave (SAW) devices, such as a SAW frequency.

Figure 5:
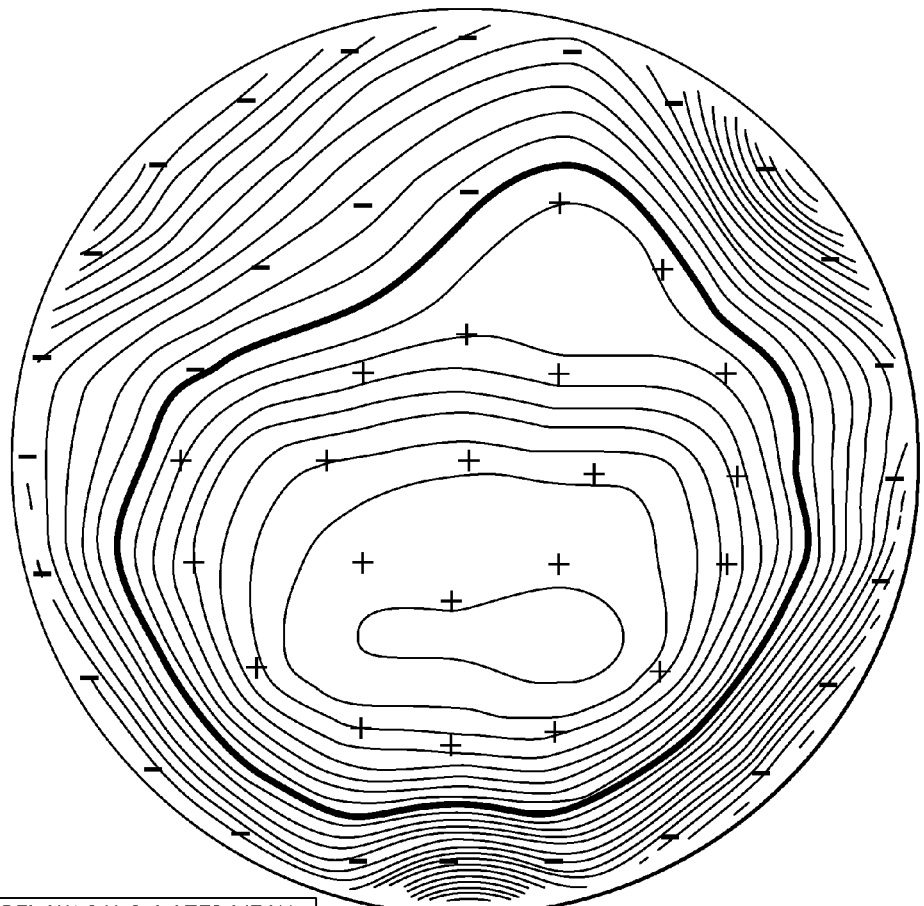
FIG. 5 is a diagrammatic view illustrating correction data for a substrate.

According to one example, FIG. 5 illustrates a film-thickness map of a wafer with an upper layer comprising a thin film or layer as measured by spectroscopic ellipsometry using a commercially available model UV-1280SE thin film measurement instrument manufactured by KLA-Tencor Corporation. As apparent from FIG. 5, the thickness of a thin film on a substrate may be mapped as a function of position.

For example, such a measurement of the initial thickness non-uniformity of an upper film layer on a substrate may be characterized ex-situ of the GCIB processing system by spectroscopic ellipsometry or other suitable conventional techniques. Such techniques can produce a point-by-point film thickness map that may be reduced to thickness contours (or similar) as shown in FIG. 5. Similarly, an in-situ uniformity-mapping instrument using spectroscopic ellipsometry or other suitable conventional film thickness mapping techniques may be incorporated within the GCIB processing system (100 or 200 in FIG. 2 or 3) for checking a profiling process. In either case, the non-uniformity measurements may be stored as a series of thickness points with precise substrate positions by a standard computer. A film measurement method such as spectroscopic ellipsometry is used to map the thickness of only the top film layer, independent of variations in substrate thickness, thickness of underlying films, or surface flatness.

As illustrated in FIG. 5, metrology data is measured at two or more locations on the substrate. Moreover, this data may be acquired and collected for a plurality of substrates. The plurality of substrates may, for instance, include a cassette of substrates. The metrology data is measured at two or more locations on at least one of a plurality of substrates and may, for example, be acquired at a plurality of locations on each of the plurality of substrates. Thereafter, the plurality of locations on each of the plurality of substrates can be expanded from measured sites to unmeasured sites using a data fitting algorithm. For example, the data fitting algorithm can include interpolation (linear or nonlinear) or extrapolation (linear or nonlinear) or a combination thereof.

Once metrology data is collected for the plurality of substrates using the metrology system 10, the metrology data is provided to the multi-process controller 20 for computing correction data. Metrology data can be communicated between the metrology system 10 and the multi-process controller 20 via a physical connection (e.g., a cable), or a wireless connection, or a combination thereof. Additionally, the metrology data can be communicated via an intranet or internet connection. Alternatively, metrology data may be communicated between the metrology system 10 and the multi-process controller 20 via a computer readable medium.

In 520, correction data is computed for a first substrate using the metrology data for the first substrate. The correction data for a given substrate comprises a process condition for modulation of the GCIB dose as a function of position on the substrate in order to achieve a change between the parametric data associated with the incoming metrology data and the target parametric data for the given substrate. For example, the correction data for a given substrate can comprise determining a process condition for using the GCIB to correct a non-uniformity of the parametric data for the given substrate. Alternatively, for example, the correction data for a given substrate can comprise determining a process condition for using the GCIB to create a specifically intended non-uniformity of the parametric data for the given substrate.

Using an established relationship between the desired change in parametric data and the GCIB dose and an established relationship between the GCIB dose and a GCIB process condition having a set of GCIB processing parameters, the multi-process controller 20 determines correction data for each substrate in the plurality of substrates. For example, a mathematical algorithm can be employed to take the parametric data associated with the incoming metrology data, compute a difference between the incoming parametric data and the target parametric data, invert the GCIB processing pattern (i.e., etching pattern or deposition pattern or both) to fit this difference, and create a beam dose contour to achieve the GCIB processing pattern using the relationship between the change in parametric data and the GCIB dose. Thereafter, for example, GCIB processing parameters can be determined to affect the calculated beam dose contour using the relationship between the beam dose and the GCIB process condition. The GCIB processing parameters can include a beam dose, a beam area, a beam profile, a beam intensity, a beam scanning rate, or an exposure time (or beam dwell time), or any combination of two or more thereof.

Many different approaches to the selection of mathematical algorithm may be successfully employed in this embodiment. In another embodiment, the beam dose contour may selectively deposit additional material in order to achieve the desired change in parametric data.

In 530, correction data is computed for a second substrate using the metrology data for the second substrate.

In 540, while computing the correction data for the second substrate, the computed correction data for the first substrate is applied to the first substrate using a gas cluster ion beam (GCIB). Instead of computing the correction data for all of the plurality of substrates prior to beginning GCIB processing, computed correction data is applied to each substrate using GCIB processing as it becomes available. In doing so, the throughput for processing a plurality of substrates is dramatically enhanced since the computation of correction data can be time consuming. Additionally, for example, the GCIB processing system may comprise the GCIB processing system described in FIG. 2 or 3. Once processed to GCIB specifications, the uniformity of the substrate(s) or distribution of the parametric data for the substrate(s) may be examined either in-situ or ex-situ and the process finished or refined as appropriate.

Although only certain embodiments of this invention have been described in detail above, those skilled in the art will readily appreciate that many modifications are possible in the embodiments without materially departing from the novel teachings and advantages of this invention. Accordingly, all such modifications are intended to be included within the scope of this invention.

What is claimed is:

1. A method of location specific processing on a plurality of substrates, comprising:
   acquiring metrology data for each of said plurality of substrates, the plurality of substrates including at least first and second substrates, wherein the metrology data for the first substrate is different from the metrology data for the second substrate;
   computing a first correction data for the first substrate using said metrology data for the first substrate;
   while computing a second correction data for said second substrate using said metrology data for the second substrate, processing said first substrate using a gas cluster ion beam (GCIB) in accordance with application of said first correction data; and applying said second correction data for said second substrate to said second substrate using another GCIB.

2. The method of claim 1, wherein said metrology data for each of said plurality of substrates comprises a film thickness, a surface roughness, a surface contamination, a feature depth, a trench depth, a via depth, a feature width, a trench width, a via width, a critical dimension (CD), or an electrical resistance, or any combination of two or more thereof.

3. The method of claim 1, wherein said metrology data for each of said plurality of substrates comprises one or more measurable parameters for one or more surface acoustic wave (SAW) devices.

4. The method of claim 1, wherein said metrology data for each of said plurality of substrates is measured at two or more locations on each of said plurality of substrates.

5. The method of claim 1, wherein said metrology data for each of said plurality of substrates comprises measurements at a plurality of locations on each of said plurality of substrates.

6. The method of claim 5, further comprising:
applying a fitting algorithm to said metrology data for said measurements at said plurality of locations on each of said plurality of substrates in order to expand said metrology data of each of said plurality of substrates to include one or more unmeasured locations on each of said plurality of substrates, respectively.

7. The method of claim 6, wherein said applying said fitting algorithm comprises applying interpolation or extrapolation or both.

8. The method of claim 1, wherein said computing said first correction data for said first substrate comprises determining a first process condition for using said GCIB to correct a non-uniformity of said metrology data for said first substrate.

9. The method of claim 1, wherein said computing said first correction data for said first substrate comprises determining a first process condition for using said GCIB to create a specifically intended non-uniformity based on said metrology data for said first substrate.

10. The method of claim 1, wherein said using said GCIB comprises using a GCIB having ionized clusters, said ionized clusters comprising helium, neon, argon, krypton, xenon, nitrogen, oxygen, carbon dioxide, sulfur hexafluoride, nitric oxide, or nitrous oxide, or any combination of two or more thereof.

11. The method of claim 1, wherein said applying said first correction data for said first substrate comprises using said GCIB and varying a beam dose, a beam area, a beam profile, a beam intensity, a beam scanning rate, or an exposure time, or any combination of two or more thereof.

12. The method of claim 1, wherein said acquiring metrology data for each of said plurality of substrates comprises measuring metrology data for each of said plurality of substrates using an in-situ metrology system or an ex-situ metrology system.

13. The method of claim 1, wherein said acquiring metrology data for each of said plurality of substrates comprises measuring metrology data for each of said plurality of substrates using an optical digital profilometer (ODP), a scatterometer, an ellipsometer, a reflectometer, an interferometer, an X-ray fluorescence spectroscopy tool, SEM, TEM, AFM, or a four-point probe, or any combination of two or more thereof.

14. A processing system configured to perform location specific processing on a plurality of substrates the plurality of substrates including at least first and second substrates, comprising:
a metrology system configured to acquire metrology data for each of the plurality of substrates wherein the metrology data for the first substrate is different from the metrology data for the second substrate
a gas cluster ion beam (GCIB) processing system configured to treat one or more of said plurality of substrates with a GCIB; and
a multi-process controller configured to:
receive said metrology data for the first substrate from the metrology system,
compute correction data for the first substrate using said metrology data for the first substrate, and
while applying a completed correction data to process the first substrate using said GCIB in accordance with application of said correction data for the first substrate, instructing said GCIB to compute correction data for the second substrate using said metrology data for the second substrate.

15. The processing system of claim 14, wherein said metrology system comprises an optical digital profilometer (ODP), a scatterometer, an ellipsometer, a reflectometer, an interferometer, an X-ray fluorescence spectroscopy tool, SEM, TEM, AFM, or a four-point probe, or any combination of two or more thereof.

16. The processing system of claim 14, wherein said GCIB processing system comprises a vacuum enclosure, a source configured to produce a GCIB inside said vacuum enclosure, and a substrate holder configured to support said given one of said plurality of substrates in said vacuum enclosure.

17. The processing system of claim 16, wherein said substrate holder is configured to adjust a position of said given one of said plurality of substrates relative to said GCIB.

18. The processing system of claim 16, wherein said source is an inert source or a reactive source.

19. A method of location specific processing on a plurality of substrates, comprising:
acquiring metrology data for each of said plurality of substrates, the plurality of substrates including at least first and second substrates, wherein the metrology data for the first substrate is different from the metrology data for the second substrate;
computing correction data for the first substrate using said metrology data for said first substrate; and
while computing correction data for the second substrate using said metrology data for the second substrate, applying a completed correction data for processing the first substrate using a gas cluster ion beam in accordance with application of said correction data for said first substrate.

20. A computer readable medium containing program instructions for execution on a gas cluster ion beam (GCIB) processing system, which when executed by the GCIB processing system, cause the GCIB processing system to perform the steps of:
acquiring metrology data for each of said plurality of substrates, the plurality of substrates including at least first and second substrates, wherein the metrology data for the first substrate is different from the metrology data for the second substrate;
computing correction data for the first substrate using said metrology data for the first substrate; and
while computing correction data for the second substrate, applying a completed correction data for the first substrate using said GCIB in accordance with application of said completed correction data for the first substrate.

* * * * *

UNITED STATES PATENT AND TRADEMARK OFFICE
CERTIFICATE OF CORRECTION

PATENT NO.         : 7,917,241 B2                           Page 1 of 1
APPLICATION NO.    : 11/832198
DATED              : March 29, 2011
INVENTOR(S)        : Steven P. Caliendo et al.

It is certified that error appears in the above-identified patent and that said Letters Patent is hereby corrected as shown below:

In the Claims:
At column 13, claim number 14, line number 63, after "substrates", insert --,--

At column 14, claim number 14, line number 1, after "substrates", insert --;--

Signed and Sealed this
Twenty-eighth Day of June, 2011

David J. Kappos
*Director of the United States Patent and Trademark Office*